United States Patent [19]

Tu et al.

[11] Patent Number: 5,335,254

[45] Date of Patent: Aug. 2, 1994

[54] SHIFT REGISTER SYSTEM FOR DRIVING ACTIVE MATRIX DISPLAY

[75] Inventors: Nang-Ping Tu; Ming-Daw Chen, both of Hsinchu, Taiwan

[73] Assignee: Industrial Technology Research Institute, Taiwan, Hsinchu, Taiwan

[21] Appl. No.: 52,689

[22] Filed: Apr. 27, 1993

[51] Int. Cl.⁵ .................. H03K 3/01; H03K 17/26
[52] U.S. Cl. ............................ 377/76; 328/62; 328/63; 328/72; 328/75; 345/10
[58] Field of Search ........................ 328/62–63, 328/72, 75; 377/76; 340/732

[56] References Cited

U.S. PATENT DOCUMENTS 4,746,915  5/1988  Sekiya ............................. 377/76
4,931,986  6/1990  Daniel et al. ..................... 377/76

Primary Examiner—Margaret Rose Wambach
Attorney, Agent, or Firm—H. C. Lin

[57] ABSTRACT

A clock control circuit for sequentially enabling the clock input terminal of a number of groups of shift register stages for reducing the power consumption. The groups are seccessively activated, and the groups currently not in operation are made not to consume power. During changeover between adjacent groups of shift register stages, the clocks for the different groups overlap to insure stable operation.

11 Claims, 6 Drawing Sheets

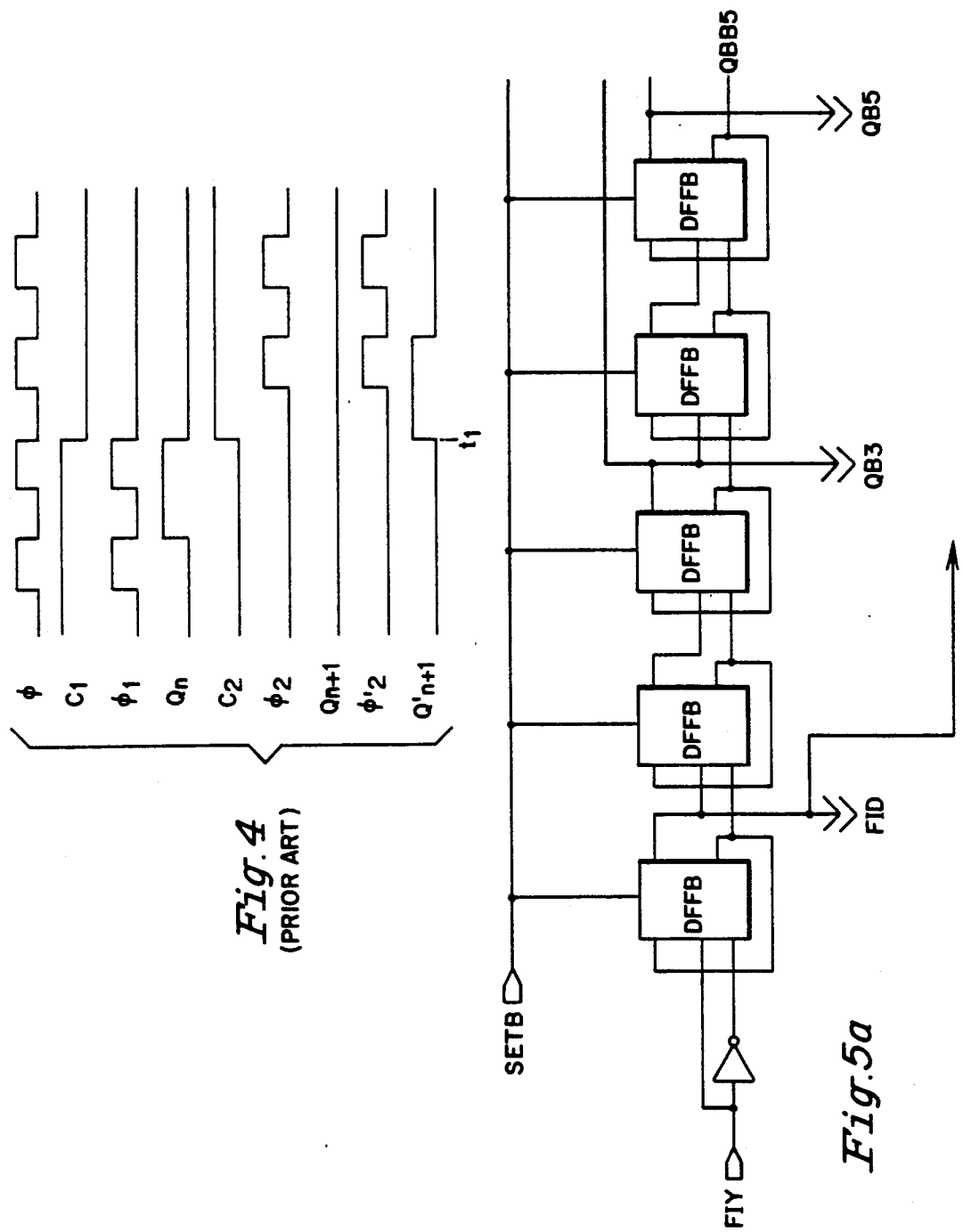

SHIFT REGISTER SYSTEM FOR DRIVING ACTIVE MATRIX DISPLAY

BACKGROUND

This invention relates to serial data transfer circuits, such as shift registers. In particular, the invention is intended for use in an active matrix liquid crystal display system for reducing the power consumption.

There is at present an urgent need for planar type display devices, such as active matrix liquid crystal display panels. Similar to the conventional types of CRT displays, the column electrodes of the matrix must be successively driven for the transfer of video signal data at a very high frequency, of the order of 4 MHz. Due to the very large number of column electrodes, considerable amount of power is consumed in charging and discharging the input capacitance of the shift registers driving the column electrodes.

FIG. 1 is a general circuit diagram of a column electrode drive circuit for a liquid crystal display device. In this figure, F1, F2, . . . , Fm are delay flip-flops connected in series to form a shift-register. In response to a clock signal $\phi$, the input video signal data D is sequentially shifted into the shift register and outputted to the different column electrodes Y1, Y2 . . . , Ym. In FIG. 2, waveform (a) shows a video signal of one horizontal line between two synchronization pulses; waveform (b) are set signals; waveform (c) shows the clock pulses; waveforms Y1, Y2, Y3, Y4 are column signals from the different flip-flops in FIG. 1. As shown in these waveforms, Y1, Y2, Y3, Y4 are non-overlapping timing signals to feed sequentially the different column electrodes of the liquid crystals.

In FIG. 1, a set of series-connected shift register stages 20 constitute the column electrode drive circuit, with a clock signal being continuously applied to shift register 20. In this case, it is necessary to provide 640 shift register stages in order to sequentially select 640 column electrodes, while each selection signal pulse must have a peak voltage of the order of 10 volts. It is necessary for the clock signal to charge and discharge all the node capacitance at a frequency of the order of 4 MHz. Since the power dissipation is equal to the product of total capacitance, frequency and the square of the peak voltage, a substantial amount of power is consumed.

A method to overcome this dissipation problem was proposed in Japanese Patent Laid-Open Publication No. 56-4184. The proposed method is shown in FIG. 3. The shift register stages constituting the column electrode drive circuits are divided into a number of groups. As shown in FIG. 3, there are k groups and each group has a shift register with flip-flops such as F1, F2, . . . , $F_n$ with corresponding outputs Q1 to Qn in the first group of shift registers and $F_{n+1}$ in subsequent groups of shift registers. These outputs are used to control the switches which connect the video signal to the different column electrodes. Terminal D is the input for the set signal for timing data as shown in FIG. 2. Terminal $\phi$ is the input terminal for the timing signal for the logic gates G1, G2, . . . , Gk to control the different groups of flip-flops. There are k number of logic gates, indicated as G1, G2, . . . , Gk. These gates are for the shift register to generate clock pulses for selectively turning on different groups of flip-flops. Thus, the shift register 37 is divided into k blocks, and only the neighboring columns are turned on by the clock pulses from the shift register. It is no longer necessary to turn on all the flip-flops in the shift register. The clock control block 10 forms a second shift register, which has output data at terminal C1, C2, . . . to sequentialy turn on one of the gates G1, G2, . . . , Gk. Block 10 is a frequency divider to divide the set clock pulse by a ratio of 1/n.

If there are m number of flip-flops in the column drive shift register 37 divided into k groups, each group has n number of flip-flops which consume power. If f is the frequency at the clock input terminal $\phi$ and c is the node capacitance of every flip flop, a conventional circuit would consume a power $p = fcmV^2$. With the grouping method, the power becomes $p_1 = fcnV^2$. Thus, by increasing the number of grouping k, the power consumption can be reduced.

The foregoing method, however, has the following disadvantages: Firstly, the operation is not stable. With reference to FIG. 4, it is assumed that the selection signal pulse Qn from the final stage Fn of the first group of shift register stages is to result in the initiation of a succeeding selection signal pulse for the first stage of the next group flip-flops $F_{n+1}$ at a time t1. That is to say, prior to time t1, the second group of shift register stages is to be selected to receive the clock signal, while after t1 the second group of shift register stages is to be selected. The corresponding clock control circuit 10 generates waveforms C1 and C2 as shown in FIG. 4, and the corresponding clock signals supplied to the first and second groups of column drive shift registers are designated as $\phi 1$ and $\phi 2$ respectively. However, as is clear from FIG. 4, signal $\phi 2$ does not undergo a level transition for data write-in of the selection signal Qn to shift register stage $Fn+1$ at time t1.

In this case, no column electrode selection pulse is outputted from column drive shift register stage $Fn+1$. In order to achieve a transfer of the selection signal from stage Fn to stage $Fn+1$ at this instant, it is necessary for the control signal pulses C1 and C2 to overlap during time t1. However, if this is done, a pulse in the form of a spike as indicated in waveform $\phi 2'$ is produced at time t1, and served as a clock signal pulse to the second group of column drive shift register stages $Fn+1$, $Fn+2$, . . . etc. This spike may false trigger the $F_{n+1}$ flip-flop to produce a selection signal pulse of the form $Q'_{n+1}$ shown in FIG. 4. Such pulses are not produced in a consistent manner, and the data transfer between the groups of shift register stages is extremely unreliable.

SUMMARY

An object of the present invention is to reduce the power dissipation of a shift register. Another object of this present invention is to implement a low power drive circuit for active matrix liquid crystal dispalys. Still another object of this invention is to implement a reliable drive circuit for active matrix liquid crystal display. A further object of this invention is to overcome the shortcomings of conventional drive circuits for active matrix liquid crystal displays.

These objects are achieved in this invention by means of a novel drive circuit. The column electrode drive circuit is formed as a shift register which is divided into a number of groups of shift register stages. A clock control circuit acts to sequentially apply clock enable signal to the groups of shift register stages by means of control signals such that when selection is changed from one group to a succeeding group of shift registers stages, the succeeding group of clocks is applied with two clocks, overlapped by an advanced group of clocks. These overlapping clocks ensure stable transfer of data between the various groups of shift register stages. In this manner, power consumption is minimized in the shift register groups which are not currently being supplied with the clock signal.

BRIEF DESCRIPTION OF THE DRAWINGS

FIG. 4 shows the waveforms, illustrating the operation of the circuit in FIG. 3.

FIGS. 5a-c show the block diagram of the clock control drive circuit based on the present invention. FIG. 5(a) shows the circuit diagram of the ripple counter in the drive circuit. FIG. (b) shows the shift register in the drive circuit. FIG. 5(c) shows the latch circuit for generating the clock signals for different groups of shift registers.

DETAILED DESCRIPTION OF THE PREFERRED EMBODIMENT

Figure 1:
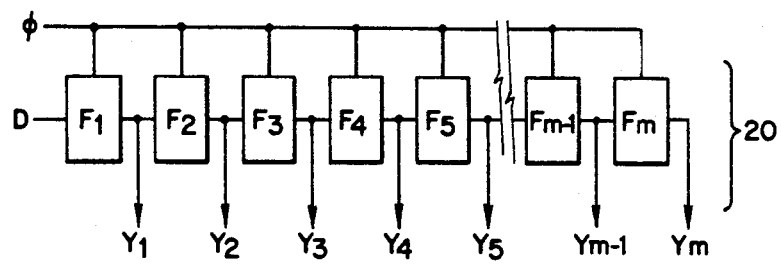
FIG. 1 is a circuit diagram of a prior-art type of electrode drive circuit for an active matrix dispaly device.
Figure 2:
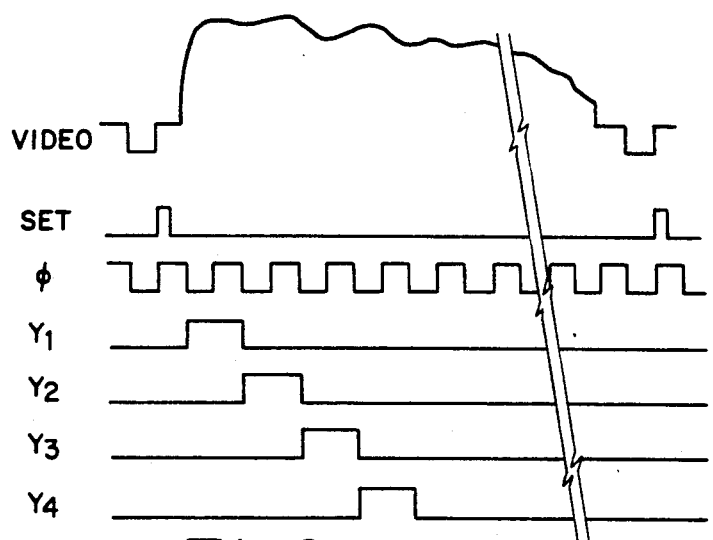
FIG. 2 shows the different waveforms illustrating the operation of the circuit of FIG. 1.
Figure 3:
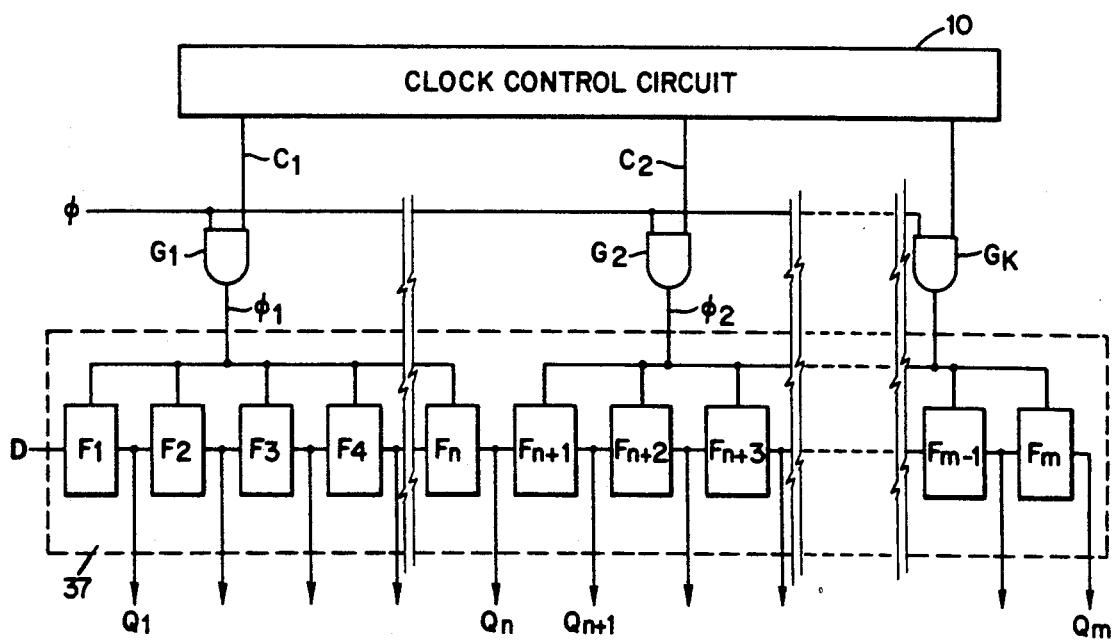
FIG. 3 shows another prior art drive circuit for an active matrix display device with provision to reduce power consumption.

The present invention is directed toward the clock control circuit 10 shown in FIG. 3. FIG. 5 shows the block diagram of a control signal generating circuit for the clock control circuit. FIG. 6 shows the block diagram of the column electrode drive circuit, which includes the clock control circuit 30. In FIGS. 5(a) shows a ripple counter, composed of a number of D-type flip-flops, DFFB's. FIY denotes a master clock signal having a frequency of the order of 4 MHz. FID is the first stage output of the five-stage ripple counter, and used as a shift register clock signal. SETB denotes a signal for setting initial data into the clock control circuit. This signal is outputted in synchronism with the horizontal sync signal of the video system. QB3 is the third-stage output of the five-stage ripple counter, having a period which is 4 times that of the output signal FID of the first stage as shown in waveform QB3 relative to the master clock signal waveform FIY in FIG. 7. A waveform QB3, which is a divided-by-4 waveform of the master clock, is inputted to control reset signal RS in a 4-stage Set/Reset latch 13 as shown in FIG. 5(c).

Figure 5B:
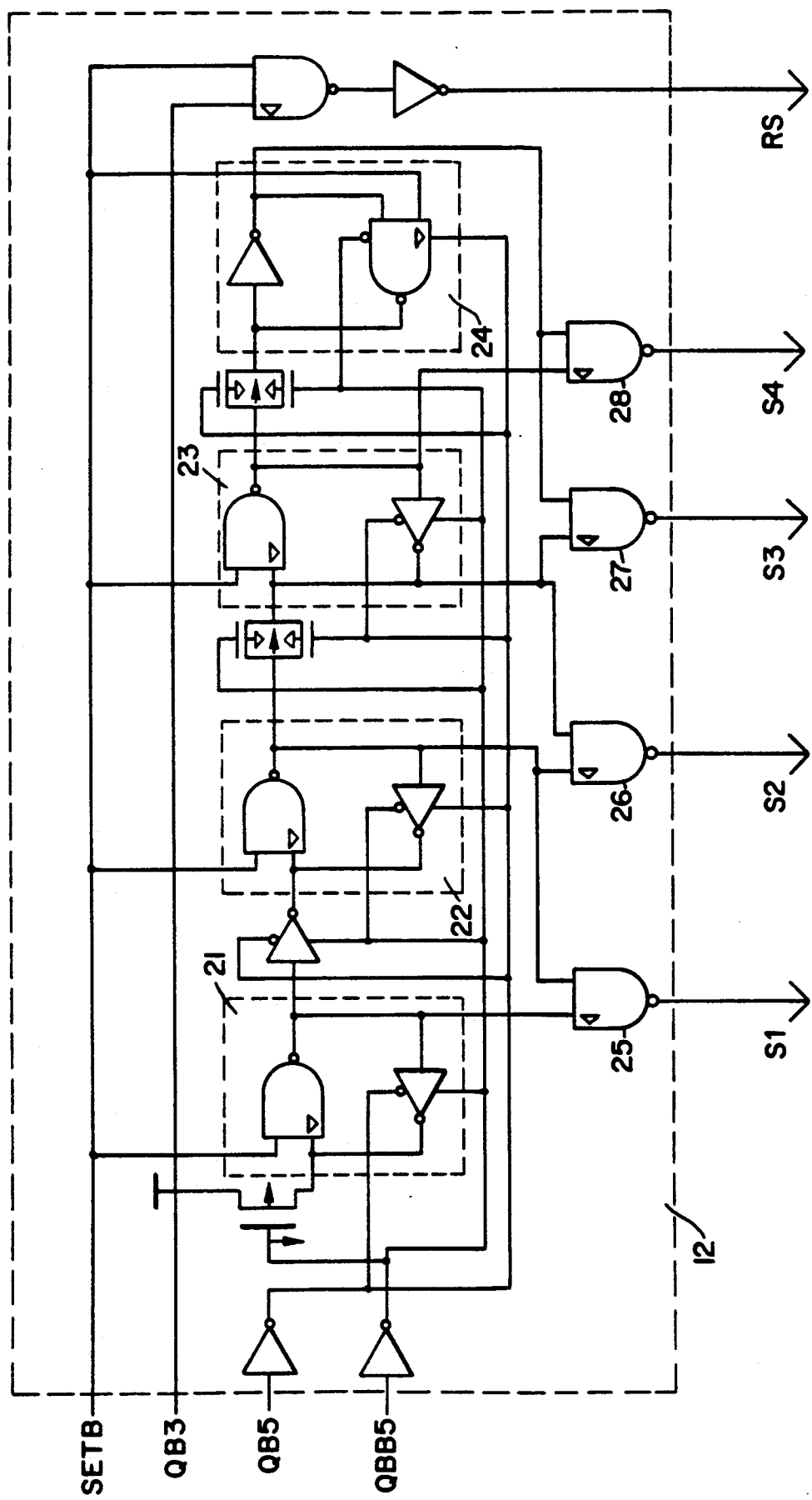
Figure 5C:
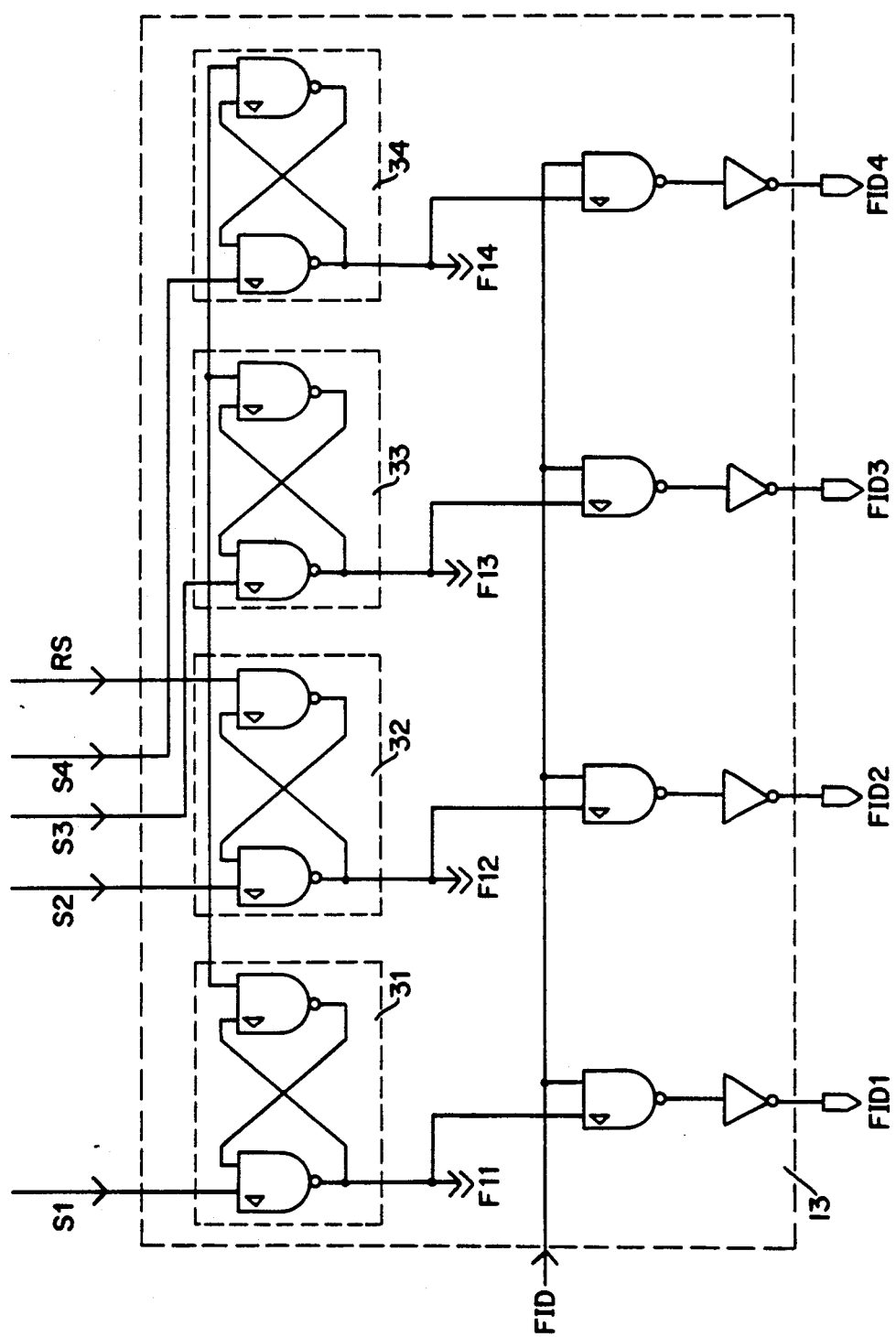
Figure 6:
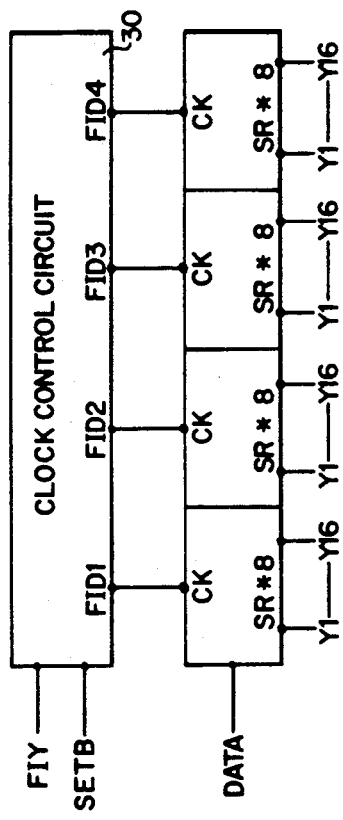
FIG. 6 shows the block diagram of the grouping of the shift registers driven by the clock control circuit of the present invention.
Figure 7:
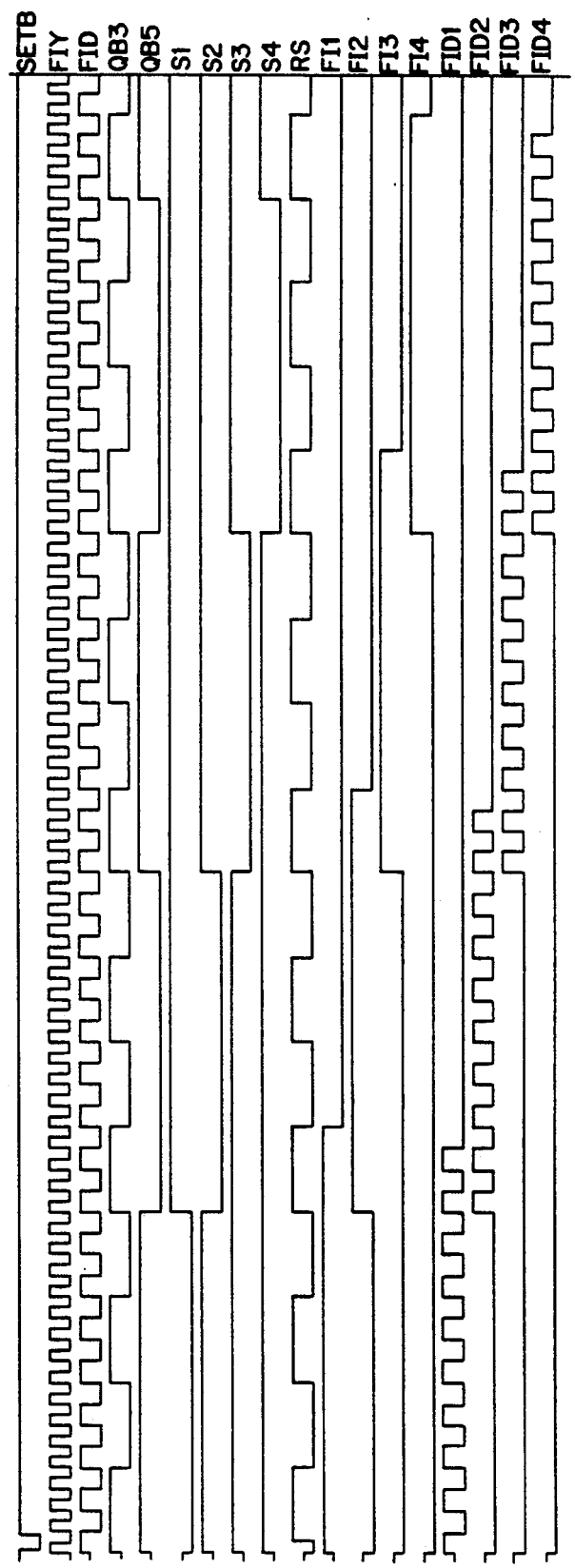
FIG. 7 shows the waveforms illustrating the operation of the present invention.

Block 13 shown in FIG. 5(b) is a shift register for generating the four-phase sequential signals S1, S2, S3, S4, used as set signal in the 4-stage Set/Reset latch 13. The circuit diagram of the shift register 12 is shown in FIG. 5(b). There are four stages 21, 22, 23, 24 in this shift register. Each stage has a cross-coupled AND gate and an inverter. The stages are coupled either by transmission gates or inverters as is commonly practised. The outputs of different stages 25, 26, 27, 28 are logically connected to four differnt NAND gates to produce the four-phase sequential (negative) signals, S1, S2, S3 S4, each having a pulse width 16 times that of the master clock FIY as shown in FIG. 7. The four-phase sequential signals S1, S2, S3, S4 are fed to the Set/Reset latch 13. The circuit diagram of Set/Reset latch is shown in FIG. 5(c). Each latch consists of two cross-coupled NAND gates. There are four latches 31, 32, 33, 34, each set by S1, S2, S3, S4, respectively. Because of the latching (or hysteresis) action, the output signal of each latch is lengthened by 4 times the master FIY clock pulse width over the set signals S1, S2, S3, S4, as shown in waveforms FI1, FI2, FI3, FI4 in FIG. 7. Thus, FI1, FI2, FI3 and FI4 become four-phase overlapping clock control signals. These overlapping signals are then fed through four NAND gates and inverters to produce four-group clock signals FID1, FID2, FID3 and FID4, which have the same clock period as the first ripple counter output FID during the positive set-signals, as shown in the waveforms in FIG. 7.

Figure 8:
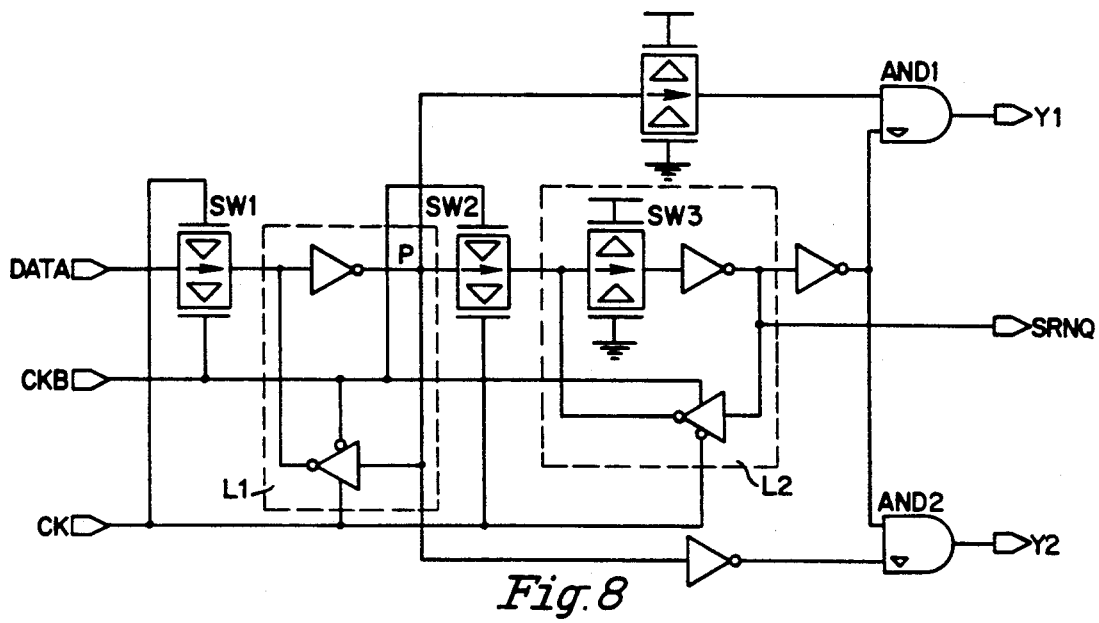
FIG. 8 shows the circuit diagram of the shift register in a group, which are controlled by overlapping clocks.
Figure 9:
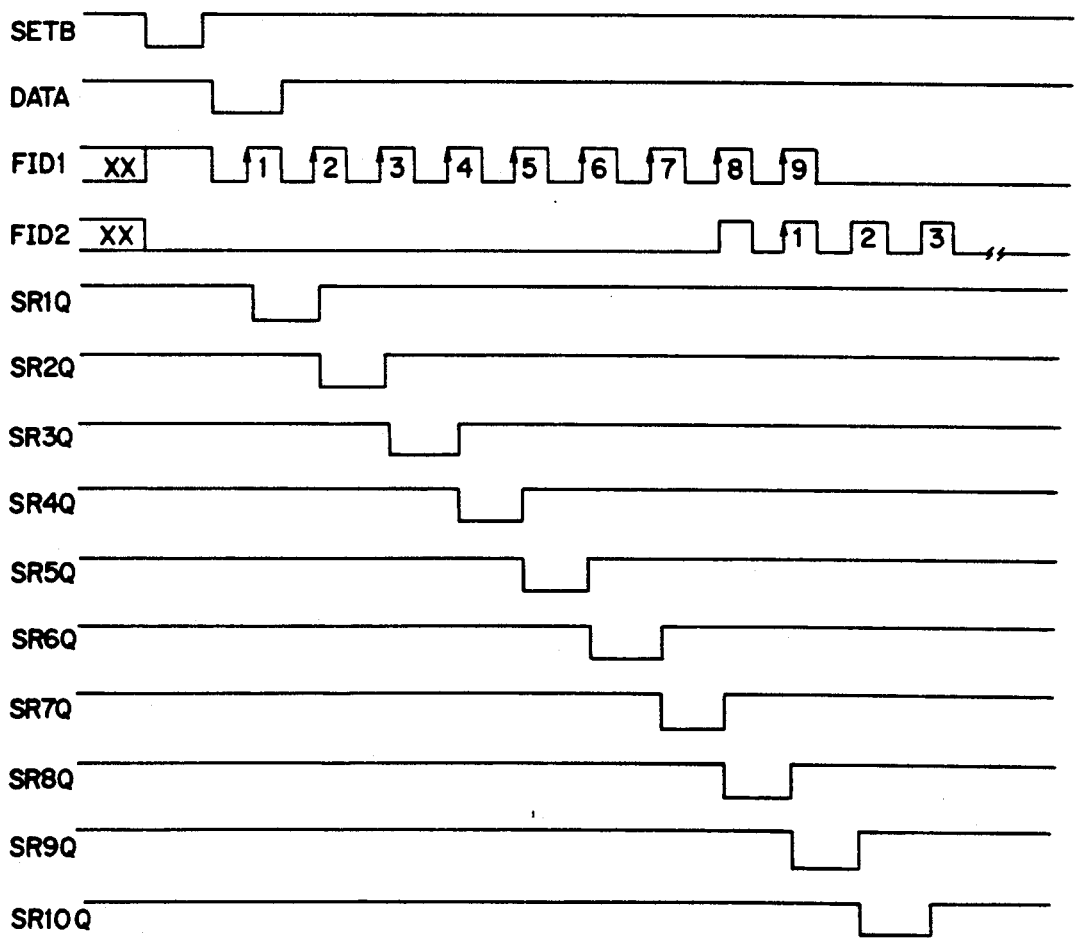
FIG. 9 shows the output waveforms of the shift registers, using the overlapping clocks of the present invention.

FID1, FID2, FID3, and FID4 are inputted respectively to the clock input terminals of the 4 groups of shift register stages SR*8 shown in FIG. 6. The four groups of FID clock signals serve as clocks for these column shift register groups. Each group has outputs Y1 through Y16. With four groups, the selection pulses output/on lines Y1, Y2, ..., Y64 from these shift register stages to control the Video/sampling transistors. The circuit diagram of the shift registers for deriving the Y1 and Y2 signals is shown in FIG. 8. Each shift register includes two cross-coupled inverters to form a latch L1 and is connected to a following latch L2 through transmission gates SW2, SW3. Thus, the two latches form a master-slave flip-flop. When the clock pulse at CK turns on the first transmission SW1, the data signal is latched as an inverted data signal at node P. When the clock is turned off, the second switch SW2 is turned on and the data signal at P is latched as the original data signal at the outout SRN0 after one complete clock cycle. The signal at P and the inverted SRN0 data signal are fed to an AND gate AND1 to produce the column signal Y1. The inverted signal at P and the inverted data signal of SRN0 are fed to another AND gate AND2 to produce the column signal Y2. The resultant column data signals are then sequentially produced as waveform SR1Q through SR10Q as shown in FIG. 9. Note that there are two overlapping clock pulses. Although the last two pulses of FID1 from the first ripple counter stage overlap with the first two clock pulses of FID2 from the second ripple counter stage, the second group of shift registers start shifting action at the second pulse of FID2, which overlaps with the last pulse of FID1. The unique feature of this shift register arrangement is that it is controlled by overlapping clocks, which is different from conventional shift registers where non-overlapping clocks are used to prevent racing.

The waveforms for the different signals are shown in FIG. 7. When the ripple counter shown in FIG. 5(a) is set by the a set signal SETB for the clock control circuit, the resultant high (H) level is outputted from every QB terminal of the ripple counter. Thus, after the SETB signal has been outputted on each rising edge of the master clock signal FIY, a group clock signal FID for clcoking sequentially the different groups of shift registers, is derived by frequency division of 2 of the clock signal FIY; QB3 is derived by frequency division of 4 of signal FID; QB5 is devided by frequency division of 16 of signal FID. When SETB signal arrives, S1 is set to low (L) level, which, in turn, sets the FI1 latched signal in FIG. 5(c) to high level, while the set signals for the second, third, and fourth latches high level S2, S3, S4 are set to H. After the SETB signal has been outputted, then on the next transition of signal QB5, S2 is set to low level, which, in turn, sets the FI2 latch signal to high level; S1 changes to high level; S3 and S4 remain at high level. After S1 changes to high level and RS changes to low level, FI1 is set to L level. Thus, the low levels of FI1 and FI2 overlap each other by an pulse width equal to two masters clock periods of FID. This overlap of two clock signal FID stabilizes the operation of data transfer between different groups of shift register stages, as shown in FIG. 9, where SR1Q through SR10Q represent the shift register outputs of respective stages, and a set of shift registers includes 8 stages of shift register in this example. It is clear that DATA transfers from the last shift register of the first group i.e. the 8th shift register) to the first shift register of the second group (i.e. the 9th shift register) is very stable.

As shown in FIG. 5(c), the production of the set signals S3, S4 is in the same manner as the set signal S1, S2, and the production of FI3, FI4 is in the same manner as FI1, FI2. The signal FID1, FID2, FID3, FID4 signals from the clock control circuit output the same clock signal as FID when clock enable signals FI1, FI2, FI3, FI4 respectively go to high level, and output low level when FI1, FI2, FI3 and FI4 respectively go to low level. Thus, the power consumption of the whole group of shift register circuit is reduced by the cancellation of unnecessary transition of the shift registers.

In FIG. 6, the shift registers are divided into 4 groups of shift register stages. However, in general, the circuit configuration can comprise any suitable number of sets, i.e. n groups of stages, where n is selected based on consideration of power consumption and circuit arrangement.

Although the present invention has been described with reference to a specific embodiment, it should be noted that various changes and modifications to this embodiment may be envisaged. Such variations are not to be regarded as a departure from the spirit and scope of the invention, and all such modifications are intended to be included within the scope of the following claims.

What is claimed is:

1. A shift register system for outputting a multiplicity of sequential control signals, comprising:
   more than one group of shift registers,
   each said group having a clock signal for shifting data signal in said group;
   a clock control circuit for producing more than one said clock signal for applying to more than one said group sequentially,
   each clock signal having a number of clock pulses which is more than the number of shift register stages in each said group to produce overlapping clock pulses with the clock pulses of adjacent groups.

2. A shift register system as described in claim 1, wherein said control signals are outputted to drive the column electrodes of an active matrix display system.

3. A shift register system as described in claim 1, wherein said control circuit comprises:
   a frequency divider for dividing a master clock frequency to a second set of clock pulses with pulse width equal to the time duration of shifting said data signal through one said group of shift register stages,
   a sequencer for deriving timing signals for sequentially clocking different said groups of shift registers,
   a clock generator for producing said overlapping clock pulses from said second set of clock pulses and from said sequencer output.

4. A shift register system as described in claim 3, wherein said frequency divider is a ripple counter.

5. A shift register system as described in claim 3, wherein said sequencer comprises a number of shift register stages.

6. A shift register system as described in claim 4, wherein the number of shift register stages in said sequencer is equal to the number of said groups.

7. A shift register system as described in claim 1, wherein said control clock generator generates two more clock pulses than the number of stages of shifts register stages in each group.

8. A shift register system as described in claim 7, wherein said control clock generator comprises a number of set/reset latches.

9. A shift register system as described in claim 1, wherein said shift register stages in said groups are master-slave flip-flops and set by the output of said clock control circuit, said shift registers in said groups comprising:
   means for producing a first output said sequential control signal when said output from said clock control circuit is on,
   means for producing a second output said sequential control signal after said output from said clock control circuit is off,
   and means for producing a data output signal for inputting a following shift register stage.

10. A shift register system as described in claim 9, wherein each said master-slave flip-flop comprises two cross-coupled inverters inputted through transmission gates, which are controlled by clocks generated from said clock control generator.

11. A shift register system as described in claim 9, wherein:
   said means for producing first output sequential control signal comprises a two input logic gate with inputs derived from said data output and the output of the master section of the master/slave flip-flop,
   and said means for producing second output sequential control signal comprises a second two input logic gate with inputs derived from said data output and the inverted output of the master section of the master/slave flip-flop.

* * * * *